(12) United States Patent
Campi, Jr. et al.

(10) Patent No.: US 8,350,329 B2
(45) Date of Patent: Jan. 8, 2013

(54) LOW TRIGGER VOLTAGE ELECTROSTATIC DISCHARGE NFET IN TRIPLE WELL CMOS TECHNOLOGY

(75) Inventors: John B. Campi, Jr., Westford, VT (US);
Shunhua T. Chang, South Burlington, VT (US); Kiran V. Chatty, Williston, VT (US); Robert J Gauthier, Jr., Hinesburg, VT (US); Junjun Li, Williston, VT (US); Rahul Mishra, Essex Junction, VT (US); Mujahid Muhammad, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 255 days.

(21) Appl. No.: 12/907,105

(22) Filed: Oct. 19, 2010

(65) Prior Publication Data
US 2012/0091530 A1 Apr. 19, 2012

(51) Int. Cl.
*H01L 23/60* (2006.01)
*H01L 21/8238* (2006.01)

(52) U.S. Cl. ......... 257/355; 257/E27.062; 257/E21.632; 438/199

(58) Field of Classification Search ........................ None
See application file for complete search history.

(56) References Cited

U.S. PATENT DOCUMENTS

| | | | |
|---|---|---|---|
| 5,572,394 A | 11/1996 | Ker et al. | |
| 5,742,085 A | 4/1998 | Yu | |
| 5,751,042 A | 5/1998 | Yu | |
| 6,194,776 B1 | 2/2001 | Amano et al. | |
| 6,399,990 B1 | 6/2002 | Brennan et al. | |
| 6,424,013 B1 * | 7/2002 | Steinhoff et al. | 257/355 |
| 6,764,892 B2 | 7/2004 | Kunz et al. | |
| 6,960,811 B2 | 11/2005 | Wu et al. | |
| 7,582,938 B2 | 9/2009 | Chen | |
| 7,595,537 B2 | 9/2009 | Kodama et al. | |
| 2002/0122280 A1 | 9/2002 | Ker et al. | |
| 2005/0224882 A1 | 10/2005 | Chatty et al. | |
| 2008/0029824 A1 | 2/2008 | Baizley et al. | |

* cited by examiner

*Primary Examiner* — Ha Tran T Nguyen
*Assistant Examiner* — Kevin Quinto
(74) *Attorney, Agent, or Firm* — Cantor Colburn LLP; Michael LeStrange

(57) ABSTRACT

An electrostatic discharge (ESD) protection device for an integrated circuit includes a buried layer of a first polarity type formed in a substrate of a second polarity type. A well region of the second polarity type is formed above the buried layer. An FET of the first polarity type is formed within the well region. An inner pair of shallow wells of the first polarity type is disposed adjacent to source and drain diffusion regions of the FET, the inner pair of shallow wells having a depth such that a bottom of the inner pair of shallow wells is above a top of the buried layer. An outer pair of deep wells of the first polarity type extends down to the top of the buried layer such that the outer pair of deep wells and the buried layer define a perimeter of the well region of the second polarity type.

16 Claims, 5 Drawing Sheets

LOW TRIGGER VOLTAGE ELECTROSTATIC DISCHARGE NFET IN TRIPLE WELL CMOS TECHNOLOGY

BACKGROUND

The present invention relates generally to the protection of integrated circuits against electrostatic discharge (ESD) voltage events and, more particularly, to a lower trigger voltage ESD protection transistor for integrated circuits.

The progression of integrated circuit technology has led to the scaling of transistors to enable faster transistors operating at lower supply voltages. In complementary metal oxide semiconductor (CMOS) applications, the faster transistors require the use of very thin gate oxides and shorter channel lengths in order to obtain higher drive currents. The gate oxide thickness, for instance, has decreased from approximately 5.0 nanometers (nm) in 0.25 micron (μm) technology to approximately 1.5 nm in 90 nm technology, and is expected to decrease even further in future technologies. The thinner gate oxides are more susceptible to failure under random ESD voltages due to their smaller breakdown voltages.

The problem of ESD voltage events occurring on input/output (I/O) pins to the integrated circuit has been addressed in many ways. Most common is the use of an ESD protection device connected to the input/output pad of an integrated circuit to safely discharge ESD currents to ground before they can damage any of the connected circuitry. ESD events may be generally characterized by a human body model (HBM), a charged device model (CDM), or a machine model (MM). Different ESD models correspond to different current pulse waveforms and different peak currents.

One of the more common devices for protecting the integrated circuits from ESD events is the use of an n-type, metal oxide semiconductor field effect transistor (NMOSFET, or NFET for short), which, when connected to the input/output connection, discharges the current produced from an ESD event to ground. Depending upon the polarity of the ESD event, the, NFET-based ESD protection device operates either as a lateral NPN bipolar junction transistor (NPN BJT) or as a diode. During an electrically positive ESD event, where the voltage on the input/output pin to which the NFET is connected spikes positive with respect to ground, the NFET device operates as a BJT to quickly dissipate the ESD current to ground. During an electrically negative ESD event, where the potential on the input/output pin spikes negative with respect to ground, the NFET operates as a diode to discharge the ESD current to ground.

The smaller breakdown voltage of the thin gate oxides and the decreasing junction breakdown voltages in the state of the art CMOS devices require that the ESD protection devices turn on and operate at voltages lower than the gate oxide or junction breakdown to enable adequate ESD protection.

SUMMARY

In one aspect, an electrostatic discharge (ESD) protection device for an integrated circuit includes a buried layer of a first polarity type formed in a substrate of a second polarity type; a well region of the second polarity type formed above the buried layer; a field effect transistor (FET) of the first polarity type formed within the well region; an inner pair of shallow wells of the first polarity type, disposed adjacent to source and drain diffusion regions of the FET, the inner pair of shallow wells having a depth such that a bottom of the inner pair of shallow wells is above a top of the buried layer; and an outer pair of deep wells of the first polarity type, extending down to the top of the buried layer, such that the outer pair of deep wells and the buried layer define a perimeter of the well region of the second polarity type.

In another aspect, an electrostatic discharge (ESD) protection device for an integrated circuit includes an N-type buried layer formed in a P-type substrate; a P-well region formed above the N-type buried layer; an N-type field effect transistor (NFET) formed within the P-well region; an inner pair of shallow N-wells, disposed adjacent to source and drain diffusion regions of the NFET, the inner pair of shallow N-wells having a depth such that a bottom of the inner pair of shallow N-wells is above a top of the buried N-type layer; an outer pair of deep N-wells of the first polarity type, extending down to the top of the N-type buried layer, such that the outer pair of deep N-wells and the buried N-layer define a perimeter of the P-well region; and one or more substrate contacts to the P-well region, disposed between the inner pair of shallow N-wells and the outer pair of deep N-wells.

In another aspect, a method of forming an electrostatic discharge (ESD) protection device for an integrated circuit includes forming an N-type buried layer in a P-type substrate; forming a P-well region above the N-type buried layer; forming an N-type field effect transistor (NFET) within the P-well region; forming an inner pair of shallow N-wells, disposed adjacent to source and drain diffusion regions of the NFET, the inner pair of shallow N-wells having a depth such that a bottom of the inner pair of shallow N-wells is above a top of the buried N-type layer; forming an outer pair of deep N-wells of the first polarity type, extending down to the top of the N-type buried layer, such that the outer pair of deep N-wells and the buried N-layer define a perimeter of the P-well region; and forming one or more substrate contacts to the P-well region, disposed between the inner pair of shallow N-wells and the outer pair of deep N-wells.

BRIEF DESCRIPTION OF THE SEVERAL VIEWS OF THE DRAWINGS

Referring to the exemplary drawings wherein like elements are numbered alike in the several Figures.

DETAILED DESCRIPTION

One particular CMOS fabrication technique which has been used in the past implements CMOS devices in a triple well architecture. The triple well architecture allows individual devices to be constructed in P-wells that are effectively isolated from the substrate and neighboring circuits, enabling good noise isolation that is essential for noise sensitive analog circuits. The triple well technology also permits different power supply voltages to be applied to different regions of the chip. Further, the triple well architecture allows individual biasing of the substrate, without affecting the bias level of the neighboring devices.

The key requirements for ESD devices is a turn-on or trigger voltage that is smaller than the turn-on or trigger voltage of the other devices that are not used for ESD protection, such as NFETs or PFETs (p-type FETs) connected to an I/O pad, for example. The ESD device should not turn on during normal operations of an I/O circuit, should provide a low resistance during the conducting state, and should have a high current handling capability.

NFETs for ESD protection have previously been implemented in triple well CMOS architecture. These devices are fabricated as an NFET within the isolated P-well of the triple well structure. In order to lower the trigger voltage of the ESD NFET, it is known to increase the substrate resistance of the NFET. Typically, the substrate resistance can be increased by increasing the distance of the substrate contact from the source/drain regions of the NFET. The disadvantage of this approach is an increased ESD NFET size. Increasing the P-well sheet resistance also increases the substrate resistance. However, the P-well sheet resistance is determined by the process technology and any change to the process to enable a higher sheet resistance for the ESD NFETs would involve additional masking layers and/or additional processing steps and therefore additional expense. Although there are other circuit techniques to lower the trigger voltage of ESD NFETs such as substrate pump circuits, such techniques result in an increase in the size of the ESD device.

Figure 1:
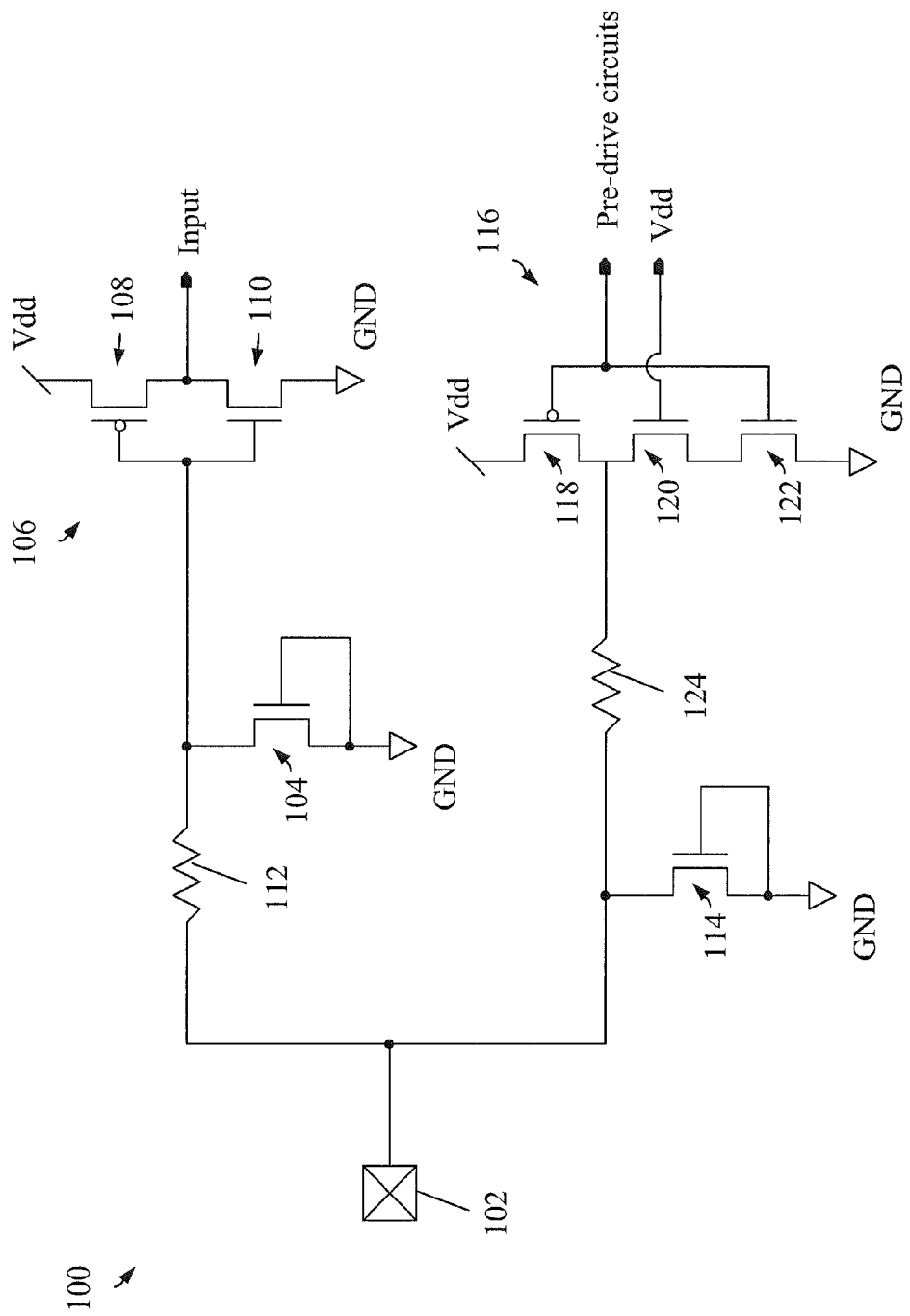
FIG. 1 is a schematic diagram illustrating the general concept of an exemplary ESD protection circuit, suitable for use in accordance with an embodiment of the invention.

Referring to FIG. 1, there is shown a schematic diagram illustrating the general concept of an exemplary ESD protection circuit 100. An ESD may be experienced on any of the input/output pads 102 of a semiconductor device. These high voltage events, although brief in duration, can be catastrophic to the connected circuitry. Accordingly, each I/O pad includes ESD protection along with the power supply terminals, Vdd and ground (GND), to avoid the catastrophic effects of an electrostatic discharge on terminals external to the circuit.

The ESD protection circuit 100 includes a first ESD NFET 104 connected across an input circuit 106 (e.g., an inverter including PFET 108 and NFET 110) connected to the I/O pad 102. The input circuit 106 receives a signal from I/O pad 102, through a resistive element 112. In addition, a second ESD NFET 114 is connected across an output drive circuit 116 (including PFET 118, NFET 120 and NFET 122), which provides a signal to I/O pad 102, through an impedance matching resistive element 124.

The protection afforded by the ESD NFET 104 diverts current produced from an ESD potential appearing on I/O pad 102 to ground before the voltage can reach a level which damages the gate oxides of transistors 108 and 110. ESD NFET 104 is shown as generally providing protection from a CDM type ESD event. Similarly, for the drive circuit 116, ESD NFET 114 limits any increase in voltage which would appear on the source and drain connections of PFET 118, NFET 120 and NFET 122 of output drive circuit 116. Because of the presence of series resistance 124, ESD NFET 114 dissipates most of the current produced in an ESD event.

During a positive mode ESD event when the potential on I/O pad 102 is positive, the ESD NFETs 104, 114 act as lateral NPN bipolar transistors for discharging current to ground. During a negative mode ESD event, the ESD NFETs 112, 114 act as a diode to ground and also discharge the current to ground. As indicated above, the turn-on or trigger voltage of the ESD devices should be smaller than the turn-on or trigger voltage of the output circuit transistors or the breakdown voltage of the gate oxides of the input circuit transistors which are connected to the I/O pad 102. During normal operation, the ESD transistors are turned off and do not interfere with signals appearing on the I/O pad 102. During a conduction state, wherein the ESD device has been triggered into conduction due to an ESD event, the on resistance for the device is preferably low to rapidly dissipate any such ESD event. Currents can be high at least on an instantaneous basis, and the ESD devices must have the ability to carry high currents for a brief period of time.

Figure 2:
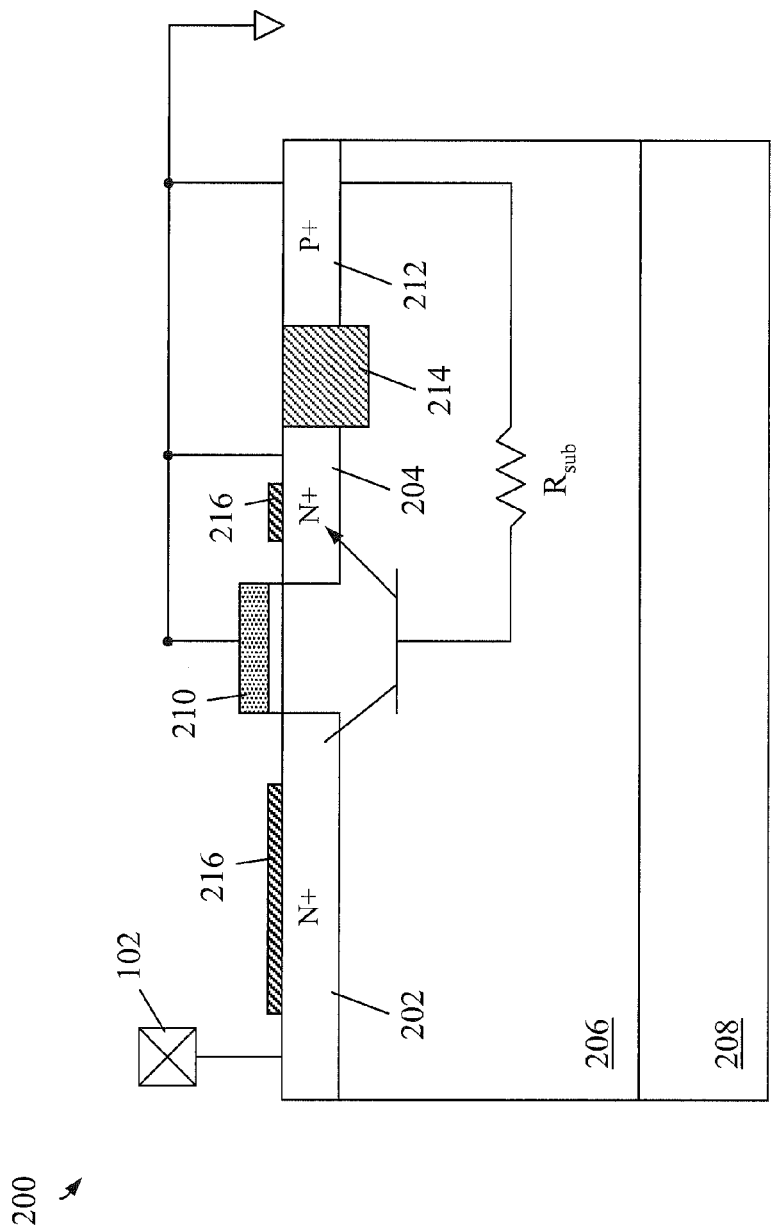
FIG. 2 is a cross sectional view of a conventional ESD NFET, illustrating the bipolar operation thereof during a positive ESD event.

A simple example of an ESD NFET that may be configured in a CMOS silicon substrate as shown in FIG. 2, which particularly illustrates how ESD NFET 200 operates as a BJT during a high positive mode ESD event. As is shown, the ESD NFET 200 includes an n-type drain region 202 and an n-type source region 204 formed within a P-well 206 in a dual well CMOS architecture formed on a p-substrate 208. A gate electrode 210 is connected to a p-type doped substrate contact 212, which also serves as a common terminal. A trench isolation region 214 is also formed to separate the source, drain and substrate contact diffusions. Further, silicide blocking regions 216 are formed on the drain region 202 and source region 204 in order to provide adequate current ballasting during an ESD event to enable a high current handling capability. The silicide blocking regions 206 are typically formed from a silicide nitride layer.

During a positive mode ESD event on the I/O pad 102, a BJT is triggered on due to a high positive potential on the drain region 202. The substrate resistance, $R_{sub}$, representing the effective resistance between the channel region of the NFET and substrate contact 212, develops a forward biasing voltage to effectively turn on the BJT for dissipating the ESD voltage on the I/O pad 102. (During a negative ESD event, the drain region 202 effectively forms a diode with the substrate and dissipates current through the substrate contact 212.)

More specifically, during the positive mode ESD event, the N+ drain/substrate junction breaks down and results in the avalanche generation of carriers (electrons and holes). The holes are collected by the substrate, thereby raising the substrate potential due to the IR drop ($V_{sub}=I_{sub}*R_{sub}$) which eventually forward biases the source/substrate junction. As a result, the source region 204, substrate contact 212, and drain region 204 act as an NPN BJT dissipating the ESD voltage. The silicide blocked regions 216 on the source region 202 and drain region 204 diffusions provide ballasting resistance to ensure a uniform flow of discharge current.

Figure 3:
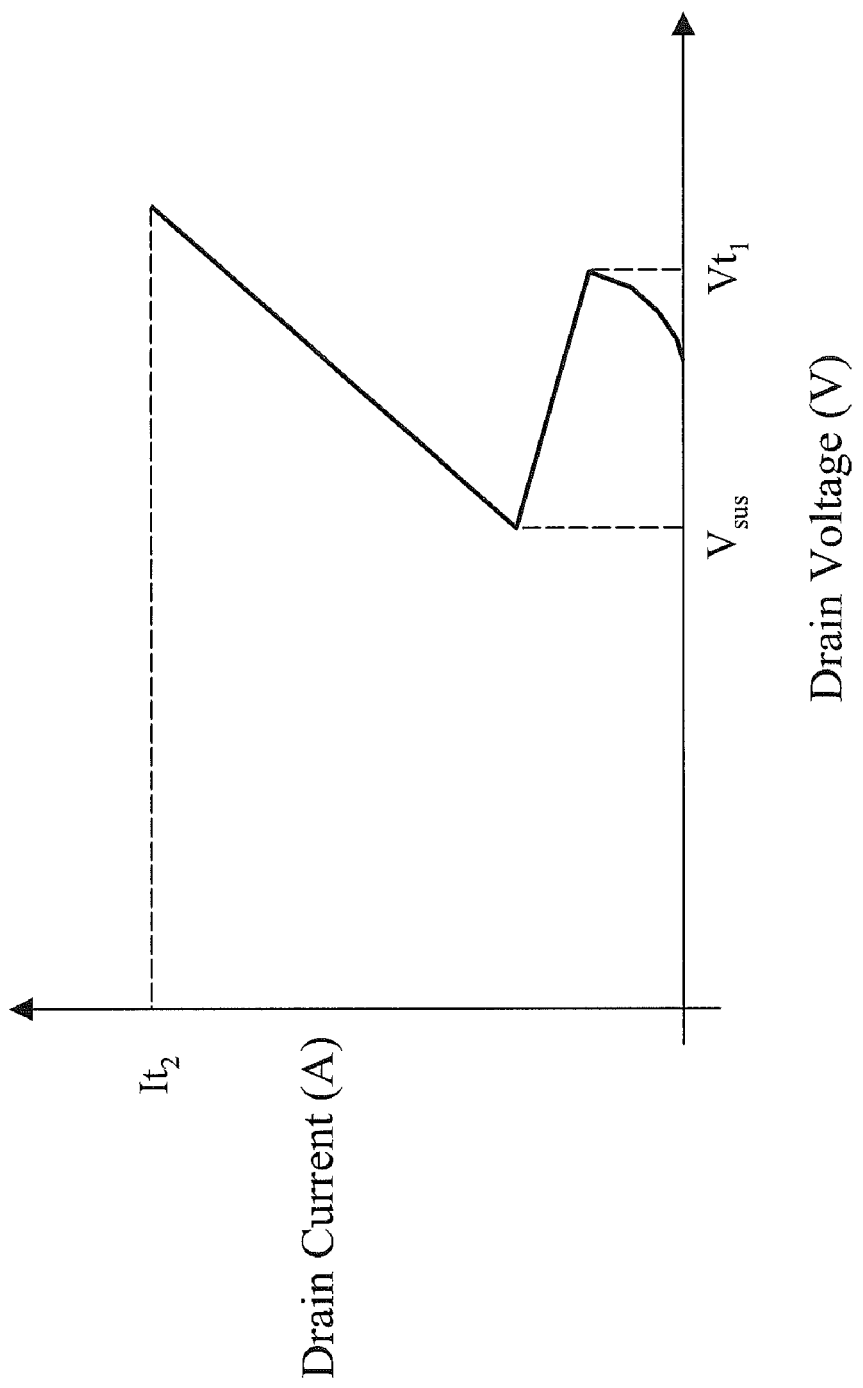
FIG. 3 is a graph illustrating the voltage-current characteristics of the ESD NFET of FIG. 2.

The typical voltage/current characteristics for a positive ESD event on the device 200 are shown in FIG. 3. The voltage on the drain of the device represents the potential due to an ESD event when the gate voltage is zero. When the potential reaches the trigger voltage, or $Vt_1$, the device is triggered into a conduction mode. The voltage at the drain begins to discharge due to the conduction of the bipolar transistor until it reaches a sustaining voltage ($V_{sus}$). From that point, current is discharged through the device, and the potential begins to rise again due to the drain diffusion resistance. In the case of CMOS technology where oxide thicknesses are becoming increasingly smaller, devices are more susceptible to damage due to an ESD event. Consequently, it is desirable to have a lower trigger voltage ($Vt_1$) to provide adequate ESD protection.

Figure 4:
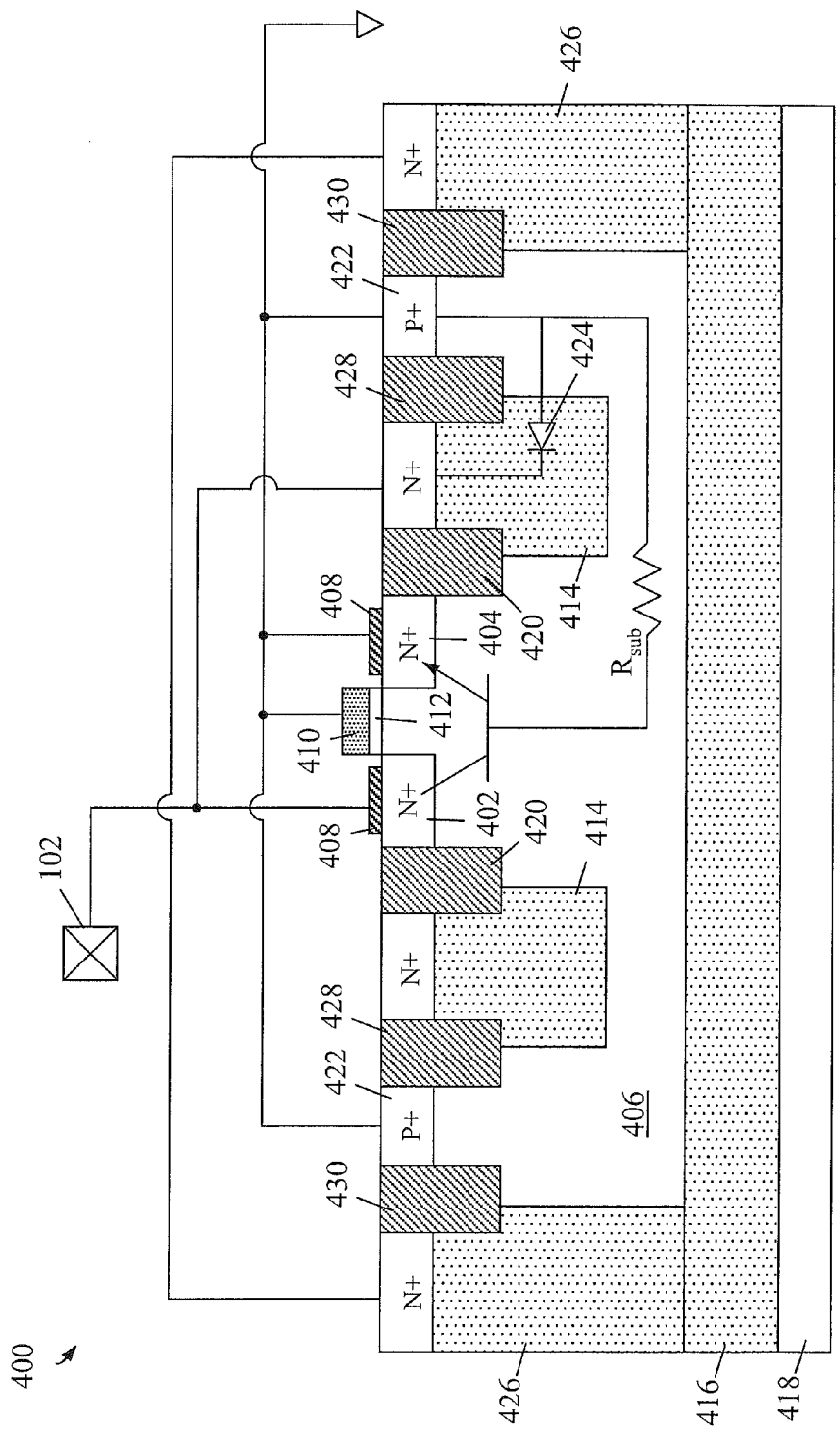
FIG. 4 is a cross sectional view of a triple well ESD NFET, in accordance with an embodiment of the invention.

Accordingly, FIG. 4 is a cross sectional view of a triple well ESD NFET 400, illustrating an exemplary embodiment of the invention. As is shown, the ESD NFET 400 includes drain 402 and source 404 diffusion regions formed within a P-well 406. Source and drain silicide blocked regions 408 are formed over the source and drain diffusion regions 404 and 402. A gate electrode 410 is formed over a thin oxide region 412 to provide a functional gate structure for the device.

Adjacent opposite ends of the source 404 and drain 402 diffusion regions is an inner pair of shallow N-wells 414. The shallow N-wells 414 are formed at a depth within the P-well 406 so as not to extend all the way down to a buried N-layer 416 formed within the P-type substrate 418 (i.e., the bottom of the N-wells 414 are above the top of the buried N-layer 416). In addition, the shallow N-wells 414 are isolated from the source and drain diffusion regions 404 and 402 by STI regions 420. Thus configured, the pair of shallow N-wells 414 serves as a guard ring around the NFET.

As further illustrated in FIG. 4, a pair of P-type substrate contacts 422 is disposed outside the shallow N-well pair 414. Thus, in addition to the increased distance of the substrate contacts 422 from the NFET channel region, the narrow P-well space between the buried N-layer 416 and the bottom of the shallow N-well pair 414 contribute to the increase in the P-well 406 substrate resistance ($R_{sub}$) as compared to a conventional structure. An integrated N-well/P-well diode 424 is also enabled, which serves as a parallel ESD diode during a negative bias ESD event on the pad 102.

Finally, an outer pair of deep N-wells 426 extends all the way down to the buried N-layer 416 so as to isolate the P-well 406 from the substrate 418. As is the case with STI regions 420, additional STI regions 428 isolate the shallow N-well pair 414 from the substrate contacts 422, and STI regions 430 isolate the substrate contacts 422 from the deep N-well pair 426. The outer pair of deep N-wells 426 and buried N-layer 416 thus define an outer perimeter of the P-well 406. As a result of the increased substrate resistance ($R_{sub}$), the ESD NFET 400 triggers at a lower voltage as compared to conventionally configured ESD NFETs connected to I/O pads, and thereby effectively protects the pads. Moreover, a lower trigger voltage of the ESD NFET 400 will also, in turn, enable a lower area requirement for the NFET. During an ESD event from an I/O pad to, for example, ground, a pad voltage develops at the pad with respect to ground. This pad voltage is mainly dependent on the trigger voltage of the ESD NFET (when ESD NFET is used as the ESD protection device) and the total width of the ESD NFET that handles ESD current. A lower trigger voltage leads to a lower pad voltage. Thus, for the same given pad voltage, a lower total width (or lower total area) of the ESD NFET could be used.

Figure 5:
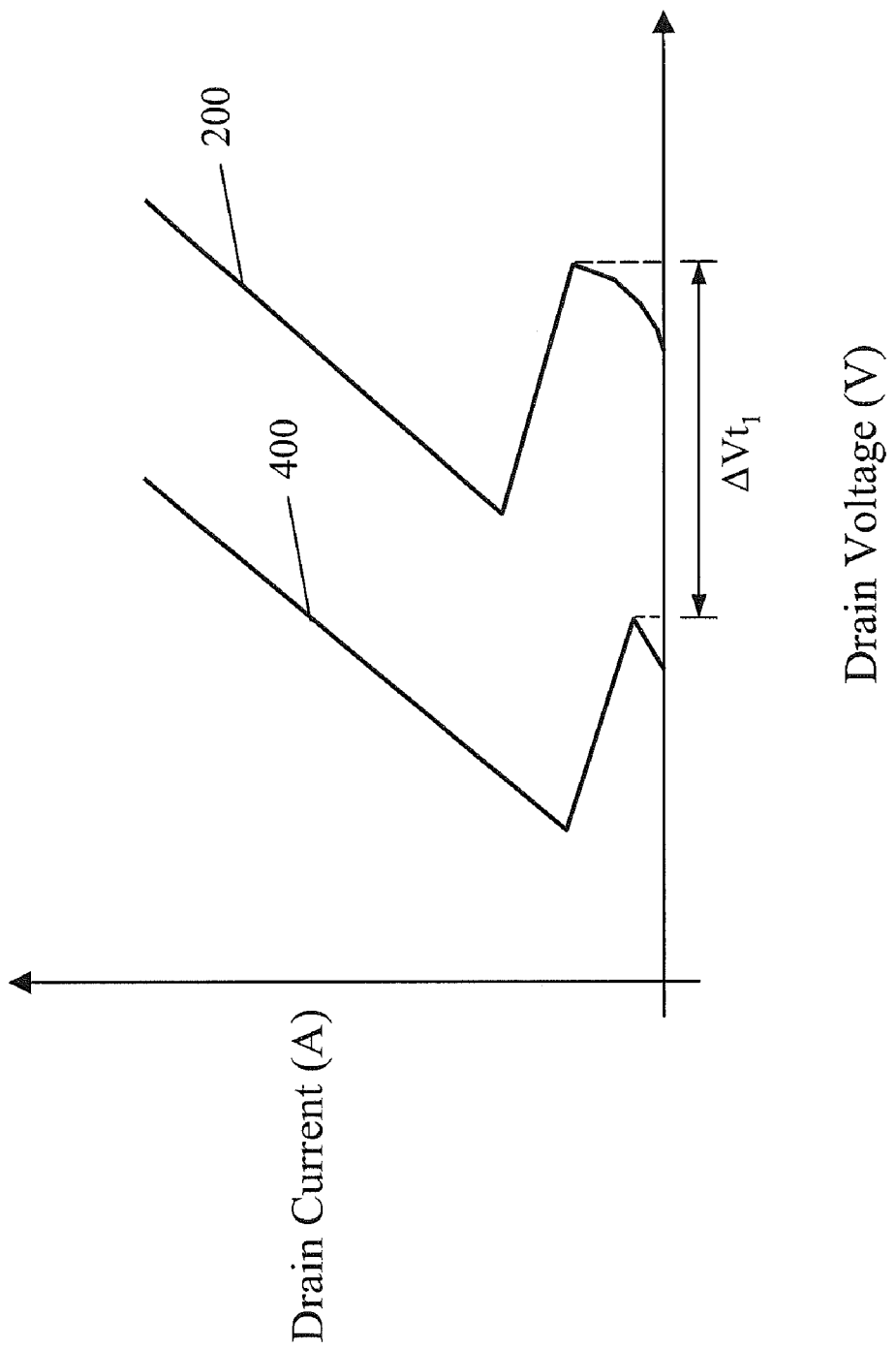
FIG. 5 is a graph comparing the voltage-current characteristics of the triple well ESD NFET of FIG. 4 with the ESD NFET of FIG. 2.

By way of further illustration, FIG. 5 is a graph comparing the voltage-current characteristics of the triple well ESD NFET of FIG. 4 with the ESD NFET of FIG. 2. As can be seen, a lower trigger voltage $Vt_1$ is obtained by the ESD NFET 400 of FIG. 4, in that conduction occurs at a lower voltage with respect to the conventional ESD NFET 200 of FIG. 2, due to the larger substrate resistance of the ESD NFET 400 of FIG. 4.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An electrostatic discharge (ESD) protection device for an integrated circuit, comprising:
    a buried layer of a first polarity type formed in a substrate of a second polarity type;
    a well region of the second polarity type formed above the buried layer;
    a field effect transistor (FET) of the first polarity type formed within the well region;
    an inner pair of shallow wells of the first polarity type, disposed adjacent to source and drain diffusion regions of the FET, the inner pair of shallow wells having a depth such that a bottom of the inner pair of shallow wells is above a top of the buried layer; and
    an outer pair of deep wells of the first polarity type, extending down to the top of the buried layer, such that the outer pair of deep wells and the buried layer define a perimeter of the well region of the second polarity type; and one or more substrate contacts to the well region, disposed between the inner pair of shallow wells and the outer pair of deep wells.

2. The ESD protection device of claim 1, wherein the first polarity type is N-type and the second polarity type is P-type.

3. The ESD protection device of claim 1, further comprising:
    first shallow trench isolation (STI) regions separating the source and drain diffusion regions from the inner pair of shallow wells;
    second STI regions separating the inner pair of shallow wells from the one or more substrate contacts to the well region; and
    third STI regions separating the one or more substrate contacts to the well region from the outer pair of deep wells.

4. The ESD protection device of claim 1, wherein the one or more substrate contacts are connected in common with a gate electrode and with the source diffusion region.

5. The ESD protection device of claim 4, wherein the drain diffusion region is connected to an input/output (I/O) pad of the integrated circuit.

6. The ESD protection device of claim 5, wherein one of the inner pair of shallow wells adjacent the source diffusion region is connected in common with the I/O pad and the drain diffusion region.

7. An electrostatic discharge (ESD) protection device for an integrated circuit, comprising:
    an N-type buried layer formed in a P-type substrate;
    a P-well region formed above the N-type buried layer;
    an N-type field effect transistor (NFET) formed within the P-well region;
    an inner pair of shallow N-wells, disposed adjacent to source and drain diffusion regions of the NFET, the inner pair of shallow N-wells having a depth such that a bottom of the inner pair of shallow N-wells is above a top of the buried N-type layer;
    an outer pair of deep N-wells of the first polarity type, extending down to the top of the N-type buried layer, such that the outer pair of deep N-wells and the buried N-layer define a perimeter of the P-well region; and
    one or more substrate contacts to the P-well region, disposed between the inner pair of shallow N-wells and the outer pair of deep N-wells.

8. The ESD protection device of claim 7, wherein the one or more substrate contacts are connected in common with a gate electrode and with the source diffusion region.

9. The ESD protection device of claim 8, wherein the drain diffusion region is connected to an input/output (I/O) pad of the integrated circuit.

10. The ESD protection device of claim 9, wherein one of the inner pair of shallow N-wells adjacent the source diffusion region is connected in common with the I/O pad and the drain diffusion region.

11. The ESD protection device of claim 7, further comprising:
- first shallow trench isolation (STI) regions separating the source and drain diffusion regions from the inner pair of shallow N-wells;
- second STI regions separating the inner pair of shallow N-wells from the one or more substrate contacts to the P-well region; and
- third STI regions separating the one or more substrate contacts to the P-well region from the outer pair of deep N-wells.

12. A method of forming an electrostatic discharge (ESD) protection device for an integrated circuit, the method comprising:
- forming an N-type buried layer in a P-type substrate;
- forming a P-well region above the N-type buried layer;
- forming an N-type field effect transistor (NFET) within the P-well region;
- forming an inner pair of shallow N-wells, disposed adjacent to source and drain diffusion regions of the NFET, the inner pair of shallow N-wells having a depth such that a bottom of the inner pair of shallow N-wells is above a top of the buried N-type layer;
- forming an outer pair of deep N-wells of the first polarity type, extending down to the top of the N-type buried layer, such that the outer pair of deep N-wells and the buried N-layer define a perimeter of the P-well region; and
- forming one or more substrate contacts to the P-well region, disposed between the inner pair of shallow N-wells and the outer pair of deep N-wells.

13. The method of claim 12, wherein the one or more substrate contacts are connected in common with a gate electrode and with the source diffusion region.

14. The method of claim 13, wherein the drain diffusion region is connected to an input/output (I/O) pad of the integrated circuit.

15. The method of claim 14, wherein one of the inner pair of shallow N-wells adjacent the source diffusion region is connected in common with the I/O pad and the drain diffusion region.

16. The method of claim 12, further comprising:
- forming first shallow trench isolation (STI) regions separating the source and drain diffusion regions from the inner pair of shallow N-wells;
- forming second STI regions separating the inner pair of shallow N-wells from the one or more substrate contacts to the P-well region; and
- forming third STI regions separating the one or more substrate contacts to the P-well region from the outer pair of deep N-wells.

* * * * *